United States Patent
Kim (10) Patent No.: US 11,223,024 B2
(45) Date of Patent: Jan. 11, 2022

(54) ORGANIC LIGHT-EMITTING DISPLAY DEVICE HAVING AN ADHESIVE LAYER BETWEEN A LOWER SUBSTRATE AND AN UPPER SUBSTRATE

(71) Applicant: LG Display Co., Ltd., Seoul (KR)

(72) Inventor: Dong-Jin Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 237 days.

(21) Appl. No.: 15/690,483

(22) Filed: Aug. 30, 2017

(65) Prior Publication Data

US 2018/0062111 A1 Mar. 1, 2018

(30) Foreign Application Priority Data

Aug. 31, 2016 (KR) ........................ 10-2016-0111718

(51) Int. Cl.
*H01L 51/52* (2006.01)
*H01L 23/544* (2006.01)
*H01L 51/00* (2006.01)
*H01L 27/32* (2006.01)

(52) U.S. Cl.
CPC ........ *H01L 51/5246* (2013.01); *H01L 23/544* (2013.01); *H01L 51/0096* (2013.01); *H01L 51/5253* (2013.01); *H01L 27/3244* (2013.01); *H01L 27/3276* (2013.01); *H01L 51/524* (2013.01); *H01L 51/5243* (2013.01); *H01L 2223/5442* (2013.01); *H01L 2223/54426* (2013.01); *Y02E 10/549* (2013.01)

(58) Field of Classification Search
CPC . H01L 51/524; H01L 51/525; H01L 27/3276; H01L 51/56; H01L 51/5246; H01L 51/5253; H01L 23/544; H01L 51/0096; H01L 27/3244; H01L 2223/5442; H01L 2223/54426; H01L 51/5243; Y02E 10/549
See application file for complete search history.

(56) References Cited

U.S. PATENT DOCUMENTS

2008/0063816 A1 3/2008 Imaizumi et al.
2008/0160864 A1* 7/2008 Song ..................... H01L 51/524
445/3

(Continued)

FOREIGN PATENT DOCUMENTS

CN 1934491 A 3/2007
CN 101896860 A 11/2010

(Continued)

OTHER PUBLICATIONS

The First Office Action dated Dec. 21, 2020, issued in corresponding Chinese Patent Application No. 201710710412.8.

*Primary Examiner* — Ermias T Woldegeorgis
(74) *Attorney, Agent, or Firm* — Morgan, Lewis & Bockius LLP (57) ABSTRACT

An organic light-emitting display device capable to improving the reliability is provided. The organic light-emitting display device may include an adhesive layer between a lower substrate and an upper substrate. Corner regions of the adhesive layer relatively disposed close to an edge of the lower substrate may include cutting portion, respectively. An align key may be disposed on the lower substrate exposed by the cutting portion of the corner region.

12 Claims, 3 Drawing Sheets

(56) References Cited

U.S. PATENT DOCUMENTS

2008/0273159 A1* 11/2008 Seok .................... G02F 1/1347
349/158
2010/0271584 A1   10/2010 Hirato
2016/0035803 A1*  2/2016 Kim ..................... H01L 27/326
257/40

FOREIGN PATENT DOCUMENTS

| CN | 104681577 A | 6/2015 |
|---|---|---|
| EP | 1 729 168 A1 | 12/2006 |
| JP | 04355720 A * | 12/1992 |

* cited by examiner

ORGANIC LIGHT-EMITTING DISPLAY DEVICE HAVING AN ADHESIVE LAYER BETWEEN A LOWER SUBSTRATE AND AN UPPER SUBSTRATE

This application claims the priority benefit of Korean Patent Application No. 10-2016-0111718, filed on Aug. 31, 2016, which is hereby incorporated by reference as if fully set forth herein.

BACKGROUND

Technical Field

The present invention relates to an organic light-emitting display device in which an upper substrate is attached to a lower substrate by an adhesive layer.

Discussion of the Related Art

Generally, an electronic appliance, such as a monitor, a TV, a laptop computer, and a digital camera, include a display device to realize an image. For example, the display device may include a liquid crystal display device and an organic light-emitting display device.

The organic light-emitting display device may include a light-emitting structure on a display area. For example, the light-emitting structure may include a lower electrode, an organic light-emitting layer and an upper electrode, which are sequentially stacked.

The organic light-emitting layer may be very vulnerable to moisture. A method of forming the organic light-emitting display device may include an encapsulation process in order to prevent or delay the external moisture to permeating the organic light-emitting layer. For example, the method of forming the organic light-emitting display device may include a step of forming a device passivation layer on the light-emitting structure and a step of attaching an upper substrate to the device passivation layer using an adhesive layer having a moisture-absorbing material.

In the organic light-emitting display device including the adhesive layer, the external moisture may permeate through the adhesive layer. In Corner regions of the adhesive layer, an area contacting with the external moisture may be a relatively wide. That is, the corner regions of the adhesive layer may have a faster rate of the moisture permeation than other regions. Thereby, in the corner regions of the adhesive layer, the swell of the moisture-absorbing material by the absorbing of the moisture may proceed relatively quickly. Thus, in the organic light-emitting display device, the deformation or the damage of the lower substrate and/or the upper substrate may occur due to the stress difference by the swell of the moisture-absorbing material within the adhesive layer.

SUMMARY

Accordingly, the present invention is directed to an organic light-emitting display device having an adhesive layer between a lower substrate and an upper substrate that substantially obviates one or more problems due to limitations and disadvantages of the related art.

An object of the present invention is to provide an organic light-emitting display device capable of decreasing a rate of the moisture permeation in a corner region of an adhesive layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light-emitting display device comprises a lower substrate, an upper substrate, and an adhesive layer. The lower substrate includes a pad portion. The upper substrate vertically overlaps the lower substrate. The lower substrate includes a non-display area exposed by the upper substrate. The pad portion is disposed at the non-display area of the lower substrate. The adhesive layer is disposed between the lower substrate and the upper substrate. Corner regions of the adhesive layer spaced far apart from the pad portion of the lower substrate include a first cutting portion, respectively.

The first cutting portions of the adhesive layer may have a chamfer shape, respectively.

First align keys may be disposed within the non-display area of the lower substrate exposed by the first cutting portions of the adhesive layer.

The first align keys may be symmetrical shapes.

Second align keys may be disposed within the non-display area of the lower substrate. The second align keys may be disposed close to the pad portion. The first align keys may be a shape different from the second align keys.

Each of the first align keys may be a concave shape with respect to the corresponding side surface of the adhesive layer.

Corner regions of the adhesive layer disposed close to the pad portion of the lower substrate may respectively include a second cutting portion. Each of the second align keys may be disposed within the corresponding second cutting portion.

A horizontal size of the adhesive layer may be smaller than a horizontal size of the upper substrate. A side surface of the upper substrate may be extended to parallel with a side surface of the adhesive layer.

The transmissivity of the upper substrate may be lower than the transmissivity of the lower substrate.

The upper substrate may include a metal.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 1:
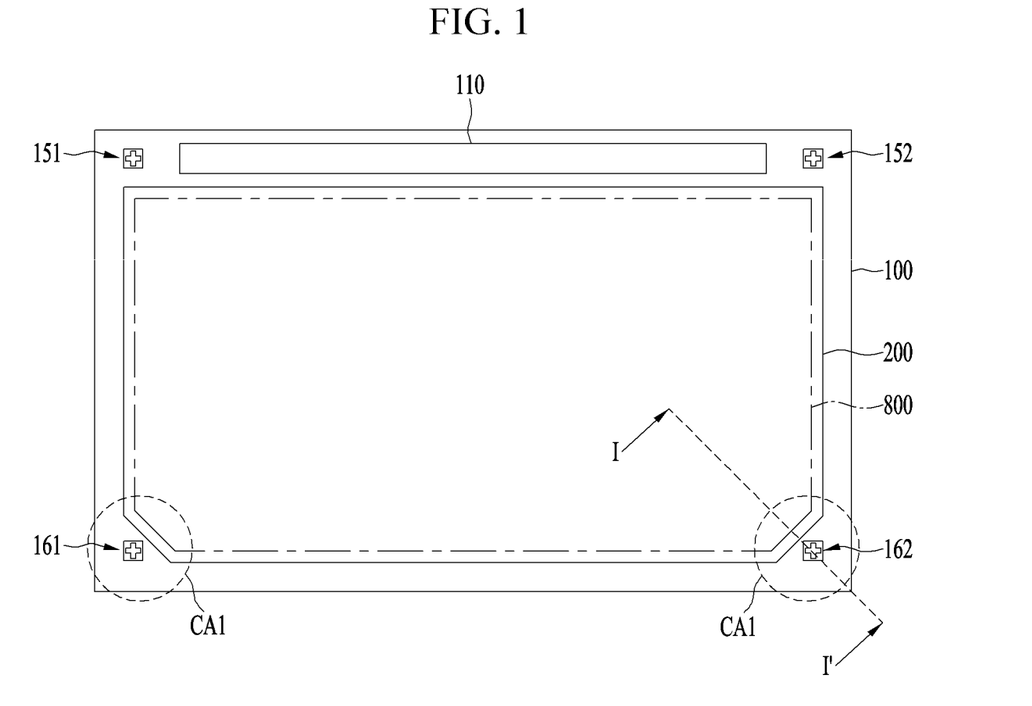
FIG. 1 is a top view schematically showing an organic light-emitting display device according to an embodiment of the present invention.
Figure 2:
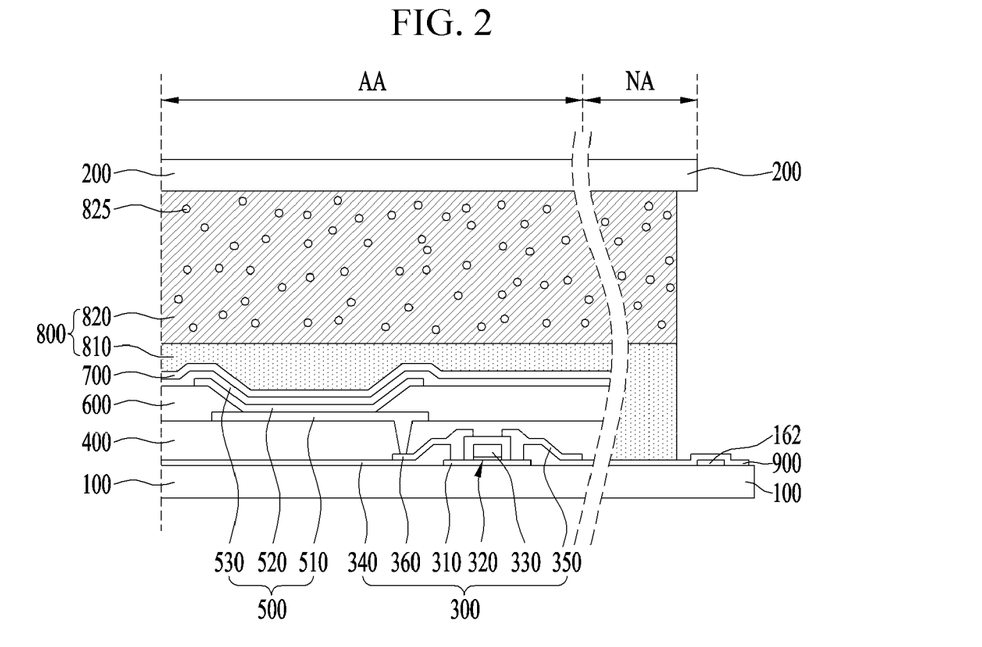
FIG. 2 is a cross-section view taken along I-I' of FIG. 1.

FIG. 1 is a top view schematically showing an organic light-emitting display device according to an embodiment of the present invention. FIG. 2 is a cross-section view taken along I-I' of FIG. 1.

Referring to FIGS. 1 and 2, the organic light-emitting display device according to the embodiment of the present invention may comprise a lower substrate 100, an upper substrate 200, a thin film transistor 300, a light-emitting structure 500 and an adhesive layer 800.

The lower substrate 100 may support the thin film transistor 300 and the light-emitting structure 500. The lower substrate 100 may include an insulating material. The lower substrate 100 may include a transparent material. For example, the lower substrate 100 may include glass or plastic.

The lower substrate 100 may include a display area AA and a non-display area NA. The non-display area NA may be disposed at the outside of the display area AA. For example, the non-display area NA may surround the display area AA. A pad portion 110 for connecting to an external device may be disposed within the non-display area NA of the lower substrate 100. For example, the pad portion 110 may be disposed outside a side surface of the display area AA.

The upper substrate 200 may be disposed on the lower substrate 100. A horizontal size of the upper substrate 200 may be smaller than a horizontal size of the lower substrate 100. For example, side surfaces of the upper substrate 200 may be disposed on an upper surface of the lower substrate 100. The upper substrate 200 may vertically overlap the display area AA of the lower substrate 100. The side surfaces of the upper substrate 200 may be disposed on the non-display area NA of the lower substrate 100.

The non-display area NA of the lower substrate 100 may be exposed by the upper substrate 200. The upper substrate 200 may expose the pad portion 110 of the lower substrate 100. For example, corner regions of the upper substrate 200 spaced far apart from the pad portion 110 of the lower substrate 100 may be disposed close to an edge of the lower substrate 100 than corner regions of the upper substrate 200 located close to the pad portion 110 of the lower substrate 100.

The upper substrate 200 may include a material having hardness more than a certain level. The upper substrate 200 may have a transmissivity lower than the lower substrate 100. For example, the upper substrate 200 may include a metal, such as aluminum (Al) and copper (Cu).

The thin film transistor 300 may be disposed between the lower substrate 100 and the upper substrate 200. For example, the thin film transistor 300 may be disposed on an upper surface of the display area AA of the lower substrate 100 facing the upper substrate 200.

The thin film transistor 300 may include a semiconductor pattern 310 disposed close to the lower substrate 100, a gate insulating layer 320 on the semiconductor pattern 310, a gate electrode 330 on the gate insulating layer 320, an interlayer insulating layer 340 covering the semiconductor pattern 310 and the gate electrode 330, a source electrode 350 on the interlayer insulating layer 340 and a drain electrode 360 spaced apart from the source electrode 350 on the interlayer insulating layer 340.

The semiconductor pattern 310 may include a semiconductor material. For example, the semiconductor pattern 310 may include amorphous silicon or polycrystalline silicon. For example, the semiconductor pattern 310 may include oxide semiconductor material, such as IGZO. The semiconductor pattern 310 may include a source region, a drain region and a channel region between the source region and the drain region.

The gate electrode 330 may overlap the channel region of the semiconductor pattern 310. The source electrode 350 may be electrically connected to the source region of the semiconductor pattern 310. The drain electrode 360 may be electrically connected to the drain region of the semiconductor pattern 310. For example, the interlayer insulating layer 340 may include a contact hole exposing the source region of the semiconductor pattern 310 and a contact hole exposing the drain region of the semiconductor pattern 310.

The gate electrode 330, the source electrode 350 and the drain electrode 360 may include a conductive material. For example, the gate electrode 330, the source electrode 350 and the drain electrode 360 may include a metal. The drain electrode 360 may include the same material as the source electrode 350. The gate electrode 330 may include a material different from the source electrode 350 and the drain electrode 360.

The gate insulating layer 320 and the interlayer insulating layer 340 may include an insulating material. The gate insulating layer 320 may be disposed between the semiconductor pattern 310 and the gate electrode 330. For example, the gate insulating layer 320 may include a side surface vertically aligned with a side surface of the gate electrode 330. The side surface of the gate insulating layer 320 may be continuous with the side surface of the gate electrode 330. The interlayer insulating layer 340 may extend beyond the semiconductor pattern 310. For example, the interlayer insulating layer 340 may cover an upper surface of the lower substrate 100 disposed near the thin film transistor 300.

The organic light-emitting display device according to the embodiment of the present invention is described that the thin film transistor 300 is in direct contact with the upper surface of the lower substrate 100. However, the organic light-emitting display device according to another embodiment of the present invention may further comprise a buffer layer between the lower substrate 100 and the thin film transistor 300. The buffer layer may include an insulating material.

The organic light-emitting display device according to the embodiment of the present invention is described that the semiconductor pattern 310 of the thin film transistor 300 is disposed close to the lower substrate 100. However, in the organic light-emitting display device according to another embodiment of the present invention, the gate electrode 330 of the thin film transistor 300 may be disposed near the lower substrate 100. For example, in the organic light-emitting display device according to another embodiment of the present invention, the semiconductor pattern 310 may be disposed between the gate electrode 330 and the source/drain electrodes 350 and 360.

The organic light-emitting display device according to the embodiment of the present invention may further comprise a planarization layer 400 on the thin film transistor 300. The planarization layer 400 may be disposed on the display area AA of the lower substrate 100. The planarization layer 400 may remove a thickness difference due to the thin film transistor 300. For example, an upper surface of the planarization layer 400 may be parallel with an upper surface of the lower substrate 100 on the display area AA of the lower substrate 100.

The light-emitting structure 500 may realize a specific color. For example, the light-emitting structure 500 may include a lower electrode 510, an organic light-emitting layer 520 and an upper electrode 530, which are sequentially stacked.

The light-emitting structure 500 may be selectively driven by the thin film transistor 300. For example, the lower electrode 510 of the light-emitting structure 500 may be electrically connected to the drain electrode 360 of the thin film transistor 300. The light-emitting structure 500 may be disposed on the planarization layer 400. The planarization layer 400 may include a contact hole exposing the drain electrode 360 of the thin film transistor 300.

The lower electrode 510 and the upper electrode 530 may include a conductive material. The upper electrode 530 may include a material different from the lower electrode 510. For example, the lower electrode 510 may include a transparent material, such as ITO and IZO, and the upper electrode 530 may include a metal having high-reflectance.

The organic light-emitting display device according to the embodiment of the present invention is described that the upper substrate 200 and the upper electrode 530 of the light-emitting structure 500 include a material having relatively lower transmissivity. However, in the organic light-emitting display device according to another embodiment of the present invention, the upper substrate 200 and the upper electrode 530 may include a transparent material. For example, the organic light-emitting display device according to another embodiment of the present invention may be top emission type in which the light is emitted toward the upper substrate 200.

The organic light-emitting layer 520 may generate light having luminance corresponding to a voltage difference between the lower electrode 510 and the upper electrode 530. The light generated by the organic light-emitting layer 520 may realize a specific color. For example, the light generated by the organic light-emitting layer 520 may realize blue color, green color, red color or white color.

The organic light-emitting layer 520 may include an emitting material layer (EML) having an organic emission material. The organic light-emitting layer 520 may have a multi-layer structure in order to increase luminous efficacy. For example, the organic light-emitting layer 520 may further include at least one of a hole injection layer (HIL), a hole transporting layer (HTL), an electron transporting layer (ETL), and an electron injection layer (EIL).

The organic light-emitting display device according to the embodiment of the present invention describes and shows only a pixel area realizing a single color. However, the organic light-emitting display device according to another embodiment of the present invention may include a plurality of the pixel area realizing different colors. For example, the organic light-emitting display device according to another embodiment of the present invention may include a red pixel area realizing red color, a blue pixel area realizing blue color, a green pixel area realizing green color and a white pixel area realizing white color.

The organic light-emitting display device according to the embodiment of the present invention may further comprise a bank insulating layer 600 covering an edge of the lower electrode 510. The organic light-emitting layer 520 and the upper electrode 530 may be stacked on a surface of the lower electrode 510 exposed by the bank insulating layer 600. The bank insulating layer 600 may include an insulating material. The lower electrodes 510 on the adjacent pixel areas may be insulated by the bank insulating layer 600. For example, the bank insulating layer 600 may include an organic insulating material, such as benzo cyclo-butene (BCB), poly-imide and photo-acryl.

The organic light-emitting display device according to the embodiment of the present invention may further comprise a device passivation layer 700 on the light-emitting structure 500. The device passivation layer 700 may prevent and/or delay that the moisture permeating from the outside moves toward the organic light-emitting layer 520 of the light-emitting structure 500. The device passivation layer 700 may include an insulating material. For example, the device passivation layer 700 may have a structure in which an organic layer having an organic material and an inorganic layer having an inorganic material are stacked alternately.

The adhesive layer 800 may be disposed between the device passivation layer 700 and the upper substrate 200. The upper substrate 200 may be attached to the device passivation layer 700 by the adhesive layer 800. The impact or the moisture permeation from the outside may be prevented and/or be mitigated by the adhesive layer 800. The adhesive layer 800 may include a lower adhesive layer 810 and an upper adhesive layer 820.

The lower adhesive layer 810 may be disposed close to the device passivation layer 700. For example, the lower adhesive layer 810 may be in direct contact with the device passivation layer 700. The lower adhesive layer 810 may be extended onto the non-display area NA of the lower substrate 100. For example, the thin film transistor 300 and the light-emitting structure 500 may be completely covered by the adhesive layer 810.

The lower adhesive layer 810 may include a curable material. For example, the lower adhesive layer 810 may include a resin, such as epoxy, phenol, unsaturated polyester, amino and olefin. The lower adhesive layer 810 may include a thermosetting resin.

The upper adhesive layer 820 may be disposed on the lower adhesive layer 810. The upper adhesive layer 820 may be in direct contact with an upper surface of the lower adhesive layer 810 and a lower surface of the upper substrate 200. The upper adhesive layer 820 may be extended onto the non-display area NA of the lower substrate 100. For example, the upper adhesive layer 820 may have a side surface vertically aligned with a side surface of the lower adhesive layer 810. The side surface of the upper adhesive layer 820 may be continuous with the side surface of the lower adhesive layer 810.

The upper adhesive layer 820 may include a curable material. For example, the upper adhesive layer 820 may include a thermosetting resin. The upper adhesive layer 820 may include a material different from the lower adhesive layer 810.

The upper adhesive layer 820 may further include the moisture-absorbing material. The stress due to the swell of the moisture-absorbing material within the upper adhesive layer 820 may be mitigated by the lower adhesive layer 810.

A horizontal size of the adhesive layer 800 may be smaller than a horizontal size of the upper substrate 200. For example, a lower surface of the extreme edge of the upper substrate 200 may be exposed by the adhesive layer 800. The adhesive layer 800 may expose a pad portion 110 of the lower substrate 100. Corner regions of the adhesive layer 800 spaced far away from the pad portion 110 of the lower substrate 100 may be disposed relatively close to an edge of the lower substrate 100 than corner regions of the adhesive layer 800 located near the pad portion 110 of the lower substrate 100.

The corner regions of the adhesive layer 800 spaced far away from the pad portion 110 of the lower substrate 100 may include a first cutting portion CA1, respectively. Each of the first cutting portions CA1 may indicate a portion where the corner region of the right angle shape is cut. For example, the first cutting portions CA1 may respectively have a chamfer shape or a bevel shape.

The below table 1 shows the rate of the moisture permeation according to the shape of the corner region in the first adhesive layer and the second adhesive layer including different materials. Herein, the cutting portion is formed by cutting the corner region of the right angle shape along the straight line connecting the points shifted by the same distance in the first direction and the second direction perpendicular to the first direction (For example, a straight line connecting a point shifted by 1 mm in the horizontal direction and a point shifted by 1 mm in the vertical direction from the vertex of the corresponding corner region).

TABLE 1

|  | Corner region of right angle shape | Corner region having cutting portion |
|---|---|---|
| 1st adhesive layer | 10.66 μm/hr | 8.80 μm/hr |
| 2nd adhesive layer | 8.53 μm/hr | 5.86 μm/hr |

Referring table 1, regardless of the material of the adhesive layer 800, it can be seen that the corner region having the cutting portion has a rate of the moisture permeation significantly lower than the corner region of the right angle shape.

Thereby, in the organic light-emitting display device according to the embodiment of the present invention, since each of the corner regions of the adhesive layer 800 disposed close to the edge of the lower substrate 100 and rapidly contacting with the external moisture includes a first cutting portion CA1, the rate of the moisture permeation may be decreased. Thus, in the organic light-emitting display device according to the embodiment of the present invention, the stress distribution due to the swell of the moisture-absorbing material within the adhesive layer 800 may be reduced.

The organic light-emitting display device according to the embodiment of the present invention may further comprise align keys 151, 152, 161 and 162 used in the alignment for etching process and/or separating process. The align keys 151, 152, 161 and 162 may include a material having high-reflectance, such as a metal. For example, the align keys 151, 152, 161 and 162 may include the same material as the gate electrode 330, the source electrode 350, the drain electrode 360 or the upper electrode 530.

The align keys 151, 152, 161 and 162 may be disposed on the non-display area NA of the lower substrate 100. The adhesive layer 800 may not cover the align keys 151, 152, 161 and 162. The align keys 151, 152, 161 and 162 may be disposed outside the upper substrate 200. For example, the align keys 151, 152, 161 and 162 may be disposed at the corner regions of the lower substrate 100. The align keys 151, 152, 161 and 162 may include a first align keys 161 and 162 which are disposed on the corner regions spaced far away from the pad portion 110 of the lower substrate 100, and a second align keys 151 and 152 which are disposed on the corner regions located close to the pad portion 110 of the lower substrate 100.

The first align keys 161 and 162 may be symmetrical shapes. The second align keys 151 and 152 may be symmetrical shapes. For example, all of the align keys 151, 152, 161 and 162 may be the same shape.

The first align keys 161 and 162 may be disposed on the first cutting portions CA1 of the adhesive layer 800. The side surface of the upper substrate 200 may be extended along the side surface of the adhesive layer 800. That is, the organic light-emitting display device according to the embodiment of the present invention may include the first align keys 161 and 162 on the non-display area NA of the lower substrate 100 exposed by the first cutting portions CA1 of the adhesive layer 800 and the upper substrate 200. Thus, in the organic light-emitting display device according to the embodiment of the present invention, a horizontal width of the non-display area NA of the lower substrate 100 may be reduced. Therefore, in the organic light-emitting display device according to the embodiment of the present invention, the size of the display area AA of the lower substrate 100 may be increased.

Accordingly, in the organic light-emitting display device according to the embodiment of the present invention, the corner regions of the adhesive layer 800 disposed close to the edge of the lower substrate 100 may respectively include a first cutting portion CA1 in order to improve the reliability, and the first align keys 161 and 162 may be disposed within the first cutting portion CA1 in order to improve the luminous efficacy.

The organic light-emitting display device according to the embodiment of the present invention may further comprise a key passivation layer 900 on the align keys 151, 152, 161 and 162. The key passivation layer 900 may completely cover the align keys 151, 152, 161 and 162. The key passivation layer 900 may include an insulating material. For example, the key passivation layer 900 may include the same material as the gate insulating layer 320, the interlayer insulating layer 340 or the device passivation layer 700.

Figure 3:
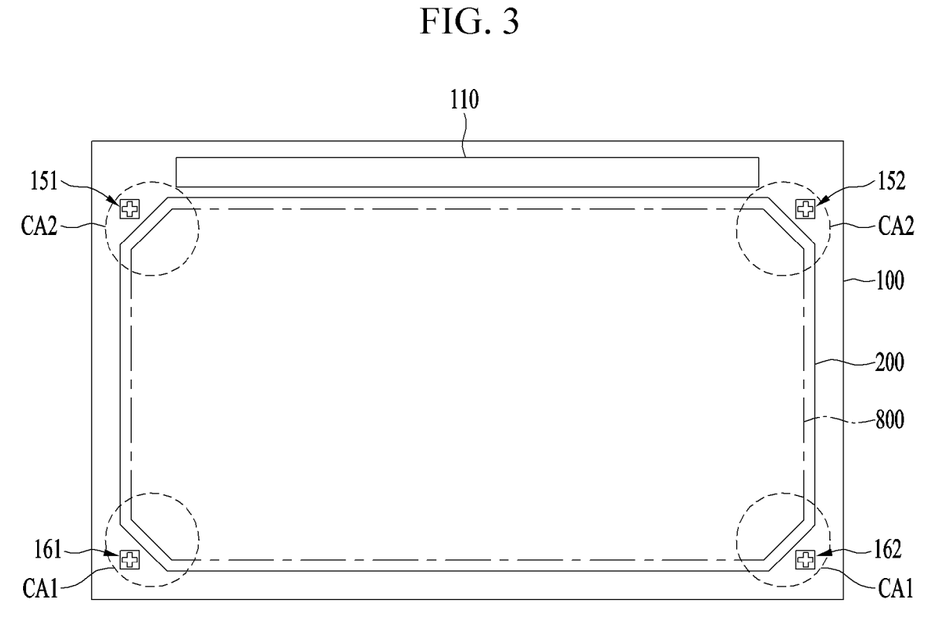
FIGS. 3 to 6 are top views respectively showing various examples of an organic light-emitting display device according to another embodiment of the present invention.

The organic light-emitting display device according to the embodiment of the present invention is described that only the corner regions of the adhesive layer 800 spaced far away from the pad portion 110 of the lower substrate 100 includes cutting portion CA1. However, in the organic light-emitting display device according to another embodiment of the present invention, all of the corner regions of the adhesive layer 800 may include a cutting portion CA1 and CA2, as shown in FIG. 3. For example, in the organic light-emitting display device according to another embodiment of the present invention, each of the corner regions of the adhesive layer 800 spaced far away from the pad portion 110 of the lower substrate 100 may include a first cutting portion CA1, and each of the corner regions of the adhesive layer 800 disposed close to the pad portion 110 of the lower substrate 100 may include a second cutting portion CA2. In the organic light-emitting display device according to another embodiment of the present invention, the second align keys 151 and 152 may be disposed within the second cutting portions CA2 of the adhesive layer 800, respectively. Thus, in the organic light-emitting display device according to another embodiment of the present invention, the pad portion 110 of the lower substrate 100 may be extended to the non-display area NA close to the corner regions of the lower substrate 100. That is, in the organic light-emitting display device according to another embodiment of the present invention, the display area AA of the lower substrate 100 may be largely increased. Therefore, in the organic light-emitting display device according to another embodiment of the present invention, the reliability and the luminous efficacy may be greatly improved.

Figure 4:
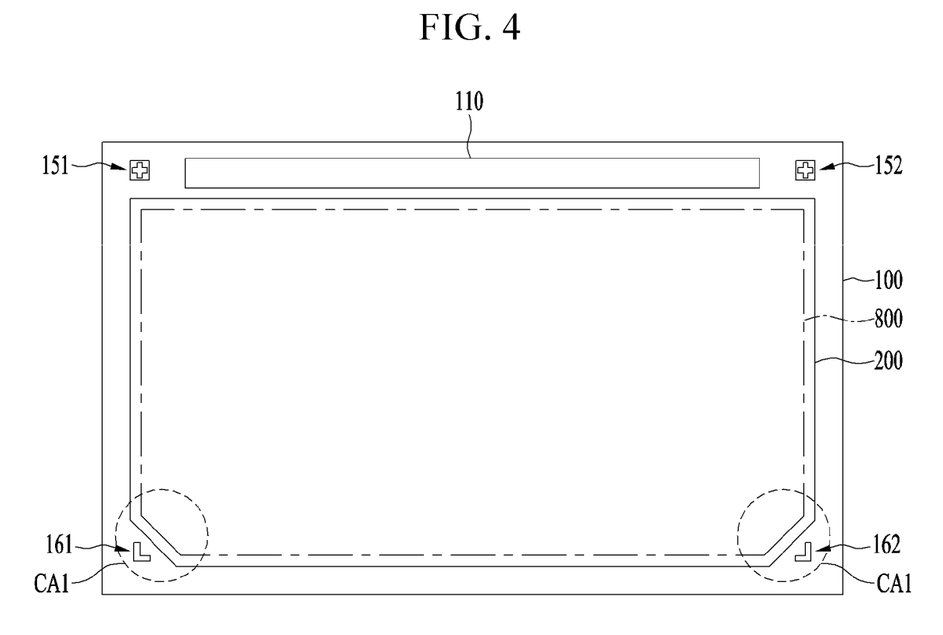

The organic light-emitting display device according to the embodiment of the present invention is described that the first align keys 161 and 162 may be the same shape as the second align keys 151 and 152. However, in the organic light-emitting display device according to another embodiment of the present invention, the first align keys 161 and 162 may be a shape different from the second align keys 151 and 152, as shown in FIG. 4. For example, in the organic light-emitting display device according to another embodiment of the present invention, each of the first align keys 161 and 162 may be a concave shape with respect to an adjacent side surface of the adhesive layer 800. For example, in the organic light-emitting display device according to another embodiment of the present invention, each of the first align keys 161 and 162 may be a 'L', shape or 'J' shape. Thus, in the organic light-emitting display device according to another embodiment of the present invention, the first align keys 161 and 162 may be sufficiently disposed within the corresponding first cutting portion CA1 of the adhesive layer 800, respectively. Therefore, in the organic light-emitting display device according to another embodiment of the present invention, the luminous efficacy may be improved by the location of the first align keys 161 and 162.

Figure 5:
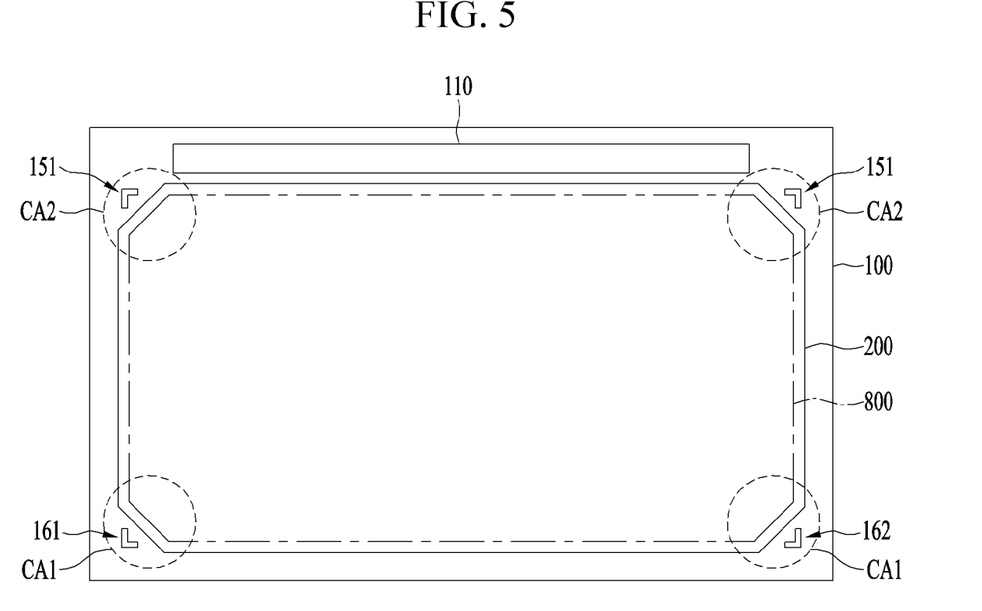
Figure 6:
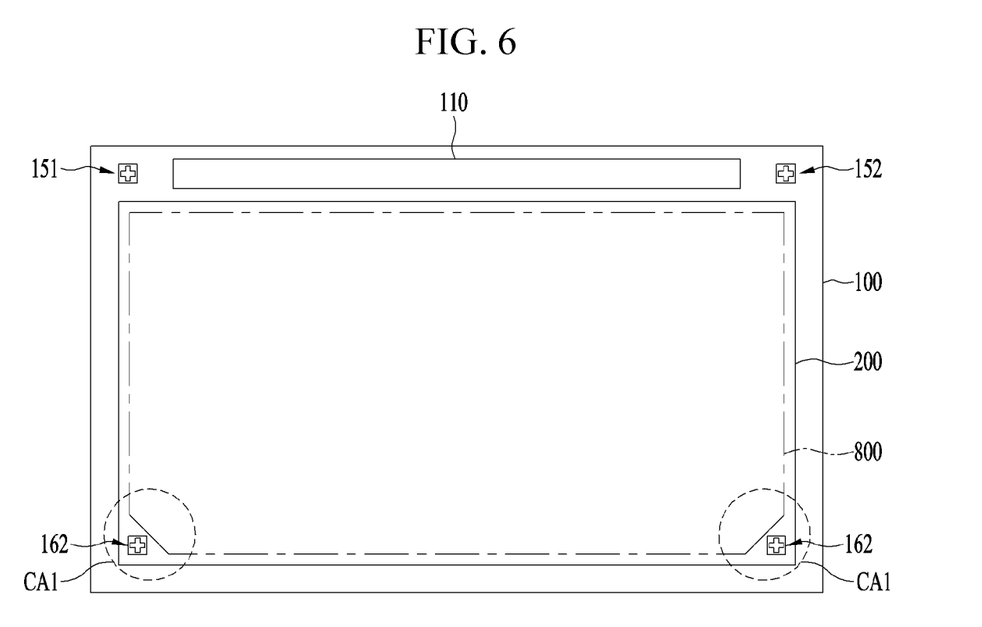

Also, in the organic light-emitting display device according to further another embodiment of the present invention, the adhesive layer 800 may include the first cutting portions CA1 and the second cutting portions CA2, the first align keys 161 and 162 may be disposed on the lower substrate 100 exposed by the first cutting portions CA1, the second align keys 151 and 152 may be disposed on the lower substrate 100 exposed by the second cutting portions CA2, and each of the align keys 151, 152, 161 and 162 may be a concave shape toward an corresponding adjacent side surface of the adhesive layer 800, as shown in FIG. 5. Thus, in the organic light-emitting display device according to further another embodiment of the present invention, each of the align keys 151, 152, 161 and 162 may be sufficiently disposed within the corresponding cutting portion CA1 and CA2 of the adhesive layer 800. Therefore, in the organic light-emitting display device according to further another embodiment of the present invention, the size of the non-display area NA of the lower substrate 100 may be minimized.

The organic light-emitting display device according to the embodiment of the present invention is described that the side surface of the upper substrate 200 extends along the side surface of the adhesive layer 800. However, in the organic light-emitting display device according to another embodiment of the present invention, the upper substrate 200 having a transparent material may be extended onto the first align keys 161 and 162 within the first cutting portions CA1 of the adhesive layer 800. Thus, in the organic light-emitting display device according to another embodiment of the present invention, overflowing the adhesive layer 800 to the side surface of the upper substrate 200 due to the miss-alignment between the upper substrate 200 and the adhesive layer 800 may be prevented, so that the reliability and the luminous efficacy may be improved.

In the result, the organic light-emitting display device according to the embodiments of the present invention may decrease the rate of the moisture permeation by changing the shape of the corner regions of the adhesive layer. Thus, in the organic light-emitting display device according to the embodiments of the present invention, the deformation and the damage of the lower substrate and/or the upper substrate due to the stress variation of the moisture-absorbing material within the adhesive layer may be prevented. Thereby, in the organic light-emitting display device according to the embodiments of the present invention, the reliability may be improved.

It will be apparent to those skilled in the art that various modifications and variations can be made in the organic light-emitting display device having an adhesive layer between a lower substrate and an upper substrate of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a lower substrate including a second side perpendicular to a first side, a third side opposite to the second side, and a fourth side opposite to the first side;
   an adhesive layer on the lower substrate, the adhesive layer including a first edge toward a first corner by the second side and the fourth side of the lower substrate, and a second edge toward a second corner by the third side and the fourth side of the lower substrate;
a first align key on the lower substrate, the first align key disposed between the first corner of the lower substrate and the first edge of the adhesive layer;
a second align key on the lower substrate, the second align key disposed between the second corner of the lower substrate and the second edge of the adhesive layer; and
an upper substrate on the adhesive layer,
wherein the first edge and the second edge of the adhesive layer have a chamfer shape, respectively, and
wherein each of the first align key and the second align key is a concave shape with respect to the corresponding edge of the adhesive layer.

2. The display device according to claim 1, further comprising:
a third align key on the lower substrate, the third align key disposed close to a third corner by the first side and the second side of the lower substrate; and
a fourth align key on the lower substrate, the fourth align key disposed close to the fourth corner by the first side and the third side of the lower substrate,
wherein the third align key and the fourth align key are spaced away from the adhesive layer.

3. The display device according to claim 2, wherein the fourth align key is symmetrical to the third align key.

4. The display device according to claim 3, wherein the third align key and the fourth align key are a shape different from the first align key and the second align key, respectively.

5. The display device according to claim 2, wherein the lower substrate includes a pad portion disposed close to the first side, and
wherein the pad portion is disposed between the third align key and the fourth align key at the outside of the adhesive layer.

6. The display device according to claim 1, wherein the second align key is symmetrical to the first align key.

7. A display device, comprising:
a first substrate, the first substrate having a first corner;
a second substrate facing the first substrate, the second substrate having a second corner; wherein the first substrate has a first area overlapping with the second substrate, and a second area along four sides of the first substrate not overlapping with the second substrate;
an intermediate layer between the first substrate and the second substrate, the intermediate layer having a third corner,
a pad portion disposed in the second area of the first substrate,
first align keys disposed at each side of the pad portion,
a second align keys symmetrically located with the first align keys in the second area of the first substrate, disposed between at least two corners of the first, second, and third corners,
wherein one of the first, second, and third corners has a chamfer shape, while other corners have a same shape other than a chamfer shape.

8. The display device according to claim 7, wherein each of the first align keys and the second align keys has a different shape.

9. The display device according to claim 8, wherein each of the first align keys and the second align keys is a concave shape with respect to the corresponding side surface of the intermediate layer.

10. The display device according to claim 7, wherein a side surface of the second substrate extends along a side surface of the intermediate layer.

11. The display device according to claim 8, wherein the first align keys and the second align keys are symmetrical.

12. The display device according to claim 7, wherein the first align keys and the second align keys are disposed outside the second substrate and the intermediate layer.

* * * * *